United States Patent [19]

Ghatalia

[11] 4,024,561
[45] May 17, 1977

[54] FIELD EFFECT TRANSISTOR MONITORS

[75] Inventor: Ashwin Kantilal Ghatalia, Essex Junction, Vt.

[73] Assignee: International Business Machines Corporation, Armonk, N.Y.

[22] Filed: Apr. 1, 1976

[21] Appl. No.: 672,687

[52] U.S. Cl. .................................. 357/23; 357/41; 324/62; 324/64
[51] Int. Cl.² ................. H01L 29/78; H01L 27/02; G01R 27/02; G01R 27/14
[58] Field of Search ................. 357/23, 41; 327/62, 327/64

[56] References Cited

UNITED STATES PATENTS

| | | | |
|---|---|---|---|
| 3,287,637 | 11/1966 | Keller | 357/23 |
| 3,974,443 | 8/1976 | Thomas | 324/62 |

Primary Examiner—Edward J. Wojciechowicz
Attorney, Agent, or Firm—Stephen J. Limanek

[57] ABSTRACT

Method and apparatus for measuring or determining characteristics, such as the actual effective width of a first conductive medium of a given design width produced by an integrated circuit process. The first conductive medium is formed apart from and parallel to a second and similar conductive medium of a given design width on an insulating medium which is disposed on a semiconductor substrate. The substrate has a first conductivity region and first and second parallel strips of a second and opposite conductivity disposed at one surface thereof within the first conductivity region for forming a channel of a given length. The first and second conductive media are arranged orthogonal to the first and second strips. A first voltage is applied between the first conductive medium and the first parallel strip and a second voltage is applied between the second conductive medium and the first parallel strip. Current is measured in the second parallel strip upon application of the first voltage and upon application of the second voltage. The actual or effective widths of the first and second conductive media are then determined by utilizing relationships between the measured currents and known constants, such as the design widths of the conductive media. In one embodiment, the etch bias of the conductive media may be obtained by forming the first and second media with different design widths. In another embodiment, the precision of alignment of an element at one level with an element at another level may be obtained by providing first and second parallel edges of a channel at one level and disposing at another level an edge of each of the first and second conductive media over the channel and parallel to the edges of the channel.

10 Claims, 3 Drawing Figures

FIELD EFFECT TRANSISTOR MONITORS

BACKGROUND OF THE INVENTION

1. Field of the Invention

This invention relates to a method and apparatus for determining characteristics, such as the actual or effective width of a conductive line or the precision of alignment of one line to another, particularly in regard to lines made by integrated circuit technology.

In the fabrication of integrated circuits in semiconductor wafers, conductive lines are formed within or over a semiconductor body, e.g., made of silicon. Conductive lines made within a semiconductor body are generally made by diffusing a dopant, such as boron or arsenic, in heavy concentration through a diffusion mask containing a given pattern, while conductive lines formed over a semiconductor body are made from a conductive layer of, e.g., aluminum or heavily doped polysilicon, disposed on an insulating layer interposed between the semiconductor body and the conductive layer. The width and length of the conductive lines formed on the insulating layer are determined, as is well known, by the pattern in a mask and photoresist and etch conditions employed.

When layouts are designed for semiconductor integrated circuits, an important consideration for successful operation of a given circuit is the actual or effective width of the conductive lines formed on or in the semiconductor body. As each layout is prepared, an optimum or design width is determined for each conductive line. This nominal width of the line can be attained only if perfect processing is employed throughout all manufacturing steps of the line. However, it is well known that masks produced for making integrated circuit lines often deviate from layout design specification due, e.g., to over or under exposure of photoresist during the mask making process. It is also known that even if the mask contains the nominal width for a desired line, over or under etching of the conductive layer produces lines that are either too thin or too wide compared with the nominal or design width. Lines produced with significant variations of width from the nominal width can cause reliability problems due to undesirable short or open circuits or resistances and, therefore, should be detected as soon as possible during the manufacturing process of an integrated circuit.

Another important characteristic of conductive lines used in semiconductor integrated circuits is the precision of their alignment with another element located on another layer or level. Lines having improper alignments can produce operational and reliability problems.

The determination of the amount of deviation of the actual line width from the nominal or design line width and the amount of misalignment can serve as a prediction at an early stage in the process of making integrated circuits of the success of the operability of the circuits.

2. Description of the Prior Art

Various systems have been suggested for determining the characteristics of lines, layers or bodies, particularly in semiconductor technology. In U.S. Pat. No. 3,650,020 a method employing a V-shaped mask pattern is described for monitoring the extent of lateral and vertical diffusion of regions of transistor elements during the production of integrated circuits, with oxide etching and photographic mask definition also being monitored during fabrication. The base width of a transistor is determined in U.S. Pat. No. 3,465,427, commonly assigned, by determining the sheet resistance of the base material, and in U.S. Pat. No. 3,440,715 by determining the current gain characteristics of test transistors. In commonly assigned U.S. application having Ser. No. 538,288, filed on Jan. 2, 1975, by D. R. Thomas, and entitled, "Conductive Line Characteristics Measuring System," there is described a system for determining etch bias by measuring voltage drops between a known distance along two conductors of different width but carrying the same or equal currents. Many well known optical systems have been used to determine line widths of conductive lines. In commonly assigned U.S. Pat. No. 3,808,527, filed on June 28, 1973, by D. R. Thomas, any misalignment of masks during the production of integrated circuits is determined by measuring appropriate voltages in a test circuit along an elongated resistor from a given contact point.

SUMMARY OF THE INVENTION

An object of this invention is to provide an improved conductive line characteristic measuring system.

It is another object of this invention to provide an improved line characteristic measuring system which requires primarily electrical measurements.

Yet a further object of this invention is to accurately and automatically determine the width and alignment of conductive lines by obtaining electrical measurements.

Still a further object of this invention is to provide a line width measuring system which is faster than known visual measurement systems and which uses a smaller area on the surface of a semiconductor substrate.

These and other objects of the invention are attained by producing a diagnostic testing system which includes a semiconductor substrate having a first conductivity region and first and second parallel strips of a second and opposite conductivity disposed at one surface thereof within the first conductivity region. First and second parallel conductors are arranged orthogonal to the first and second strips and on an insulating layer disposed on the substrate. A first voltage is applied between the first conductor and first strip and a second voltage is applied between the second conductor and the first strip. Current is measured in the second strip upon application of the first voltage and upon application of the second voltage. The actual or effective widths of the conductors are then determined by utilizing relationships between the measured currents and known constants, such as design width of the conductors and the magnitudes of the applied first and second voltages.

In one embodiment etch bias is determined. In this embodiment, two conductors of different design width are formed by the same integrated circuit process. The process effects the width of both conductors by a constant amount, however, the percent change in the width of each conductor is different. The net change in the width and the actual width of each conductor are then calculated.

In another embodiment the precision of the alignment of elements located on two different levels or layers is obtained. In this embodiment, the effective width of the first and second conductors is determined by the elements on the two different levels, with one edge of the conductors being determined by one level or layer and the other edge by the other level or layer. The first and second conductors are so formed that when one layer is misaligned to the other, the width of one of the conductors gets larger by the amount of misalignment whereas the width of the other conductor gets smaller by the same amount. By measuring appropriate currents in the substrate and utilizing relationships between these currents known constants, the amount of misalignment is determined.

The foregoing and other objects, features and advantages of the invention will be apparent from the following more particular description of the preferred embodiments of the invention, as illustrated in the accompanying drawing.

DESCRIPTION OF THE PREFERRED EMBODIMENTS

Figure 1:
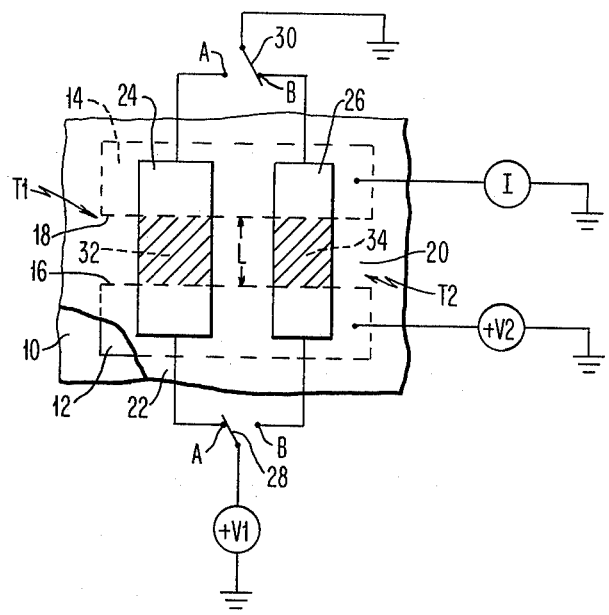
FIG. 1 is a plan view of a portion of a semiconductor body or wafer showing an embodiment of a circuit used for determining etch bias.

Referring to the drawing now in more detail, there is shown in FIG. 1 a portion of a semiconductor wafer or chip 10, preferably made of silicon of p-type conductivity in which there has been produced first and second diffusion strips 12 and 14, of n-type conductivity, having parallel edges 16 and 18 defining a channel area 20 in a kerf area or test site which may be adjacent to memory or logic arrays. The diffusion strips 12 and 14 may be produced by any known techniques employing a conventional mask and a suitable impurity such as boron, arsenic or phosphorous. An insulating layer 22 made, for example, of silicon dioxide is formed on the wafer 10 over the diffusion strips 12 and 14. It should be understood that the diffusion strips 12 and 14 are produced simultaneously with other patterns for making diffusion regions for the memory or logic arrays and that the insulating layer 22 is formed over the entire wafer or chip including the area utilized by the memory and logic arrays.

A first conductor 24 having a design width W1$d$ and a second conductor 26 having a design width W2$d$ substantially narrower than the design width W1$d$ of the first conductor 24 are formed over the channel area 20 and extending beyond the edges 16 and 18 of diffusion strips 12 and 14. The conductors 24 and 26 are arranged parallel to each other and orthogonal to the edges 16 and 18 of the diffusion strips 12 and 14.

A first voltage source +V1 is connected between ground and a first switch 28 having contacts A and B. The contact A is connected to the first conductor 24 and contact B is connected to the second conductor 26. A second voltage source +V2 is connected between ground and the first diffusion strip 12. The second diffusion strip 14 is connected to ground through an ammeter I. A second switch 30 having contacts A and B connects the first and second conductors 24 and 26 to ground, through contacts A and B, respectively. It can be seen that by applying appropriate voltages to the first and second conductors 24 and 26 and to the first diffusion strip 12 from sources +V1 and +V2, the channel area 20 will become conductive under the first conductor 24 forming a first conductive region 32 and under the second conductor 26 forming a second conductive region 34, both regions indicated by shading in FIG. 1 of the drawing. The arrangement forms two field effect transistors T1 and T2 having conductors 24 and 26, respectively, as gate electrodes and sharing first and second diffusion strips 12 and 14, with strip 12 being a drain electrode and strip 14 being a source electrode.

In this embodiment of the invention, etch bias is obtained by providing the first conductor 24 with a wider width W1$d$ than the width W2$d$ of the second conductor 26. The processing of the semiconductor wafer affects the width of both the first and second conductors 24 and 26 by a constant amount, however, the percent change in each of the conductors 24 and 26 is different. This difference is used to determine the net change in the dimension.

In the operation of the circuit illustrated in FIG. 1 of the drawing, a positive voltage from the first voltage source +V1 is applied to conductor 24 through the switch 28 and the conductor 26 is grounded through the switch 30. The magnitude of the voltage from source +V1 need only be large enough to turn on transistor T1 by producing the first conductive region 32 in the channel area 20. Current I1$s$ then flows from the second voltage source +V2 through the drain electrode 12, the conductive region 32 and the source electrode 14 to ground via the ammeter I which measures the source current I1$s$. The voltage supplied by source +V2 may be, for example, +2 volts. In a similar manner, by applying the voltage from source +V1 to the second conductor 26 and grounding the conductor 24, the conductive region 34 is produced and ammeter I reads source current I2$s$. It should be noted that the conductors 24 and 26 were grounded to prevent current from passing through the unselected transistor T1 or T2 when measuring the source currents.

In order to determine the etch bias the invention uses the following relationships:

$$W1 = W1d - \Delta W, \quad (1)$$

and $$W2 = W2d - \Delta W, \quad (2)$$

where $W1$ and $W$ are the actual or effective widths of the first and second conductors 24 and 26 and $\Delta W$ is the etch bias or difference between the design and the actual widths of the conductors 24 and 26.

$$I1s = \frac{\gamma}{2} \cdot \frac{W1}{L} (V1gs - Vt1)^2, \text{ and} \quad 3.$$

$$I2s = \frac{\gamma}{2} \cdot \frac{W2}{L} (V2gs - Vt2)^2, \text{ where} \quad 4.$$

$\gamma$ is the normalized transconductance, $L$ is the channel length, $V1gs$ and $V2gs$ are the gate to source voltages of transistors T1 and T2, which as indicated hereinabove may be equal to +2 volts and $Vt1$ and $Vt2$ are the threshold voltages of transistors T1 and T2, which, as is well known, are readily measurable.

By dividing equation 3. by equation 4., $$\frac{I1s}{I2s} = \frac{W1(V1gs - Vt1)^2}{W2(V2gs - Vt2)^2}, \text{ therefore,}$$

-continued $$\frac{I1s(V2gs - Vt2)^2}{I2s(V1gs - Vt1)^2} = \frac{W1}{W2},$$

now
W1/W2 may be defined as K, since all the elements are known or measurable, and therefore, $$K = W1/W2$$

and $$W1 = KW2.$$

By substituting for W1 in equation 1. we can rewrite equation 1. as $$KW2 = W1d - \Delta W$$

and by subtracting equation 2. from this equation we get $$W2(K-1) = W1d - W2d,$$

therefore, $$W2 = \frac{W1d - W2d}{K-1}.$$

Thus, the actual width W2 of the second conductor 26 is readily obtained. By substituting the value of W2 in equation 2., the etch bias $\Delta W$ is determined. Accordingly, it can be seen that the etch bias is obtained simply in a very small area which requires very little more space than that required to form two parallel transistors. It should also be noted that other values, such as the actual width W1 of the first conductor 24, may also be obtained.

Figure 2:
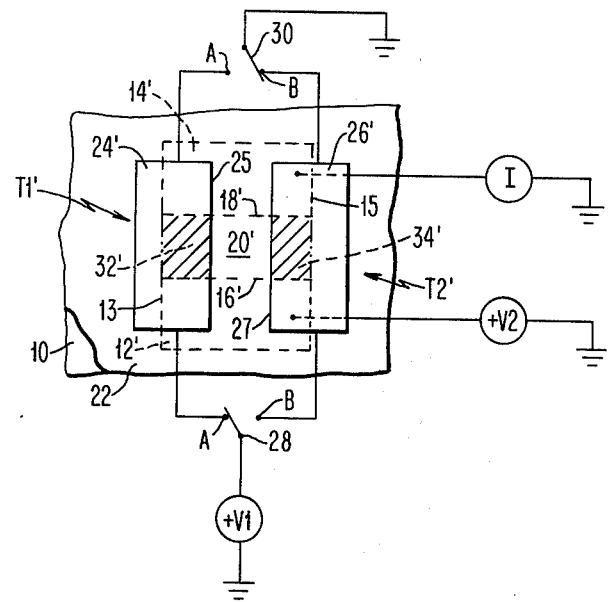
FIG. 2 is a plan view similar to that of FIG. 1 but showing an embodiment of a circuit which is used to measure misalignment between two integrated semiconductor levels or layers.

In the embodiment of the invention illustrated in FIG. 2, the field effect transistor monitor determines the amount of misalignment between two levels or layers produced by a semiconductor integration process. One of the two layers may be the diffusions, such as 12 and 14, in the semiconductor substrate 10 and the other layer may be the first metalization layer such as the layer forming gate electrodes of transistors, for example, the gate electrodes 24' and 26' of transistors T1' and T2', respectively, shown in FIG. 2 of the drawing. In FIG. 2 which is a plan view similar to the plan view of FIG. 1, like elements have the same reference numerals and similar elements have the same reference numeral with a prime. In FIG. 2, the diffusion strips 12' and 14' have outside edges along lines 13 and 15. The channel area 20', consequently is confined to the area bounded by lines 13 and 15 and the edges 16' and 18' of the diffusion strips 12' and 14'. An edge 25 of first conductor 24' is disposed within the channel area 20' formed between strips 12' and 14'. The effective area 32' of the first conductor 24' is thus defined by edges 13, 16', 18' and 25. An edge 27 of second conductor 26' is also disposed within the channel area 20'. The effective area 34' of the second conductor 26' is thus defined by edges 15, 16', 18' and 27. The width of the conductors 24' and 26' may be made equal. Also, it should be understood that the design width of the effective areas 32' and 34' is understood to be equal, i.e., the distance between edge 13 and edge 25 should be equal to the distance between edge 15 and edge 27 for the two levels to be in perfect alignment. In accordance with this embodiment, the amount of misalignment, if any, is determined. It can also be seen that when one layer gets misaligned with the other, the width of effective areas of one conductor gets larger by the amount of misalignment whereas the other gets smaller by the same amount.

To determine the amount of misalignment the invention uses the following relationships:

$$W1 = W1d + \Delta W \qquad \text{1a.}$$

and $$W2 = W2d - \Delta W \qquad \text{2a.}$$

The source currents I1s and I2s are determined in the same manner as described in connection with the embodiment of FIG. 1, accordingly, it can be stated that W1/W2 is also equal to a constant which may be considered as R.

Therefore, $$W1 = RW2$$

and $$RW2 = W1d + \Delta W.$$

By adding this last equation to equation 2a. and since W1d and W2d are equal, we get $$W2 + RW2 = 2WD,$$

where
$$WD = W1d = W2d,$$

and thus, $$W2 = (2WD)/(1+R).$$

The difference between the design width WD and the actual width W2 of the effective area of conductor 26' is equal to the misalignment $\Delta W$. Of course, W1 may also be determined if desired.

Figure 3:
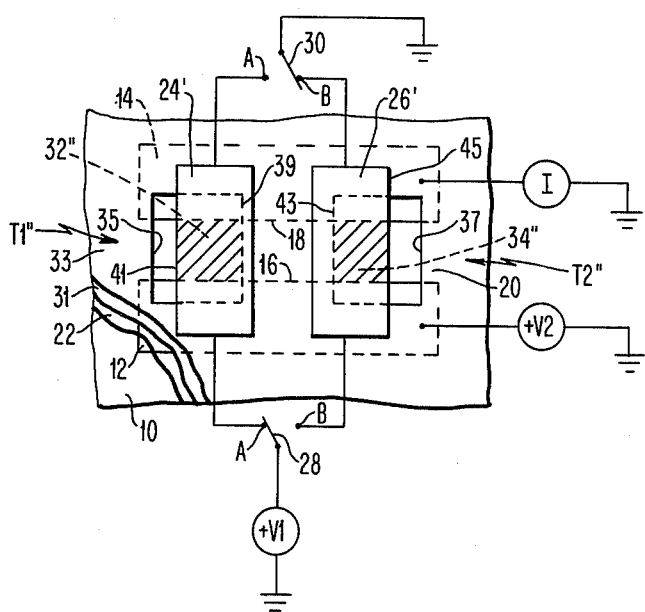
FIG. 3 is a plan view showing a modification of the embodiment of the invention illustrated in FIG. 2.

In FIG. 3 there is illustrated a modification of the misalignment monitor shown in FIG. 2. FIG. 3 is similar to FIG. 2 except that a layer of doped polycrystalline silicon 31 is interposed between the surface of substrate 10 and the first and second conductors 24' and 26'. The doped silicon layer 31 is insulation from the conductors 24' and 26' by a layer of insulation 33. The doped silicon layer 31 has two openings 35 and 37 therein. The edge 39 of opening 35 and the edge 41 of the first conductor 24' define the width W1 of the effective area 32'' for the gate electrode of transistor T1'', and the edge 43 of the opening 37 and the edge 45 of the second conductor 26' define the width W2 of the effective area 34'' for the gate electrode of transistor T2''.

The misalignment $\Delta W$ in FIG. 3 is determined in the same manner as was determined in connection with the misalignment in FIG. 2. It can be seen that the modification described in connection with FIG. 3 can determine misalignment between two layers or levels above the surface of the substrate 10 by again using only a small substrate surface area required by two parallel transistors.

While the invention has been particularly shown and described with reference to preferred embodiments thereof, it will be understood by those skilled in the art that various changes in form and details may be made therein without departing from the spirit and scope of the invention.

What is claimed is:

1. A monitoring system for determining channel widths comprising,
   a semiconductor substrate having a first conductivity region and first and second parallel strips of a second conductivity disposed at one surface thereof within said first conductivity region,
   a first conductive strip having a nominal width and a second conductive strip having a nominal width arranged parallel to each other and extending between said first and second parallel strips for forming first and second conductive channels, respectively, in said first conductivity region,
   a thin dielectric medium interposed between said conductive strips and said substrate,
   means for selectively applying a first voltage between said first conductive strip and said first parallel strip and for selectively applying a second voltage between said second conductive strip and said first parallel strip, and
   means for measuring current flow in said second parallel strip upon application of said first voltage and upon application of said second voltage to determine in relationship with the nominal width of at least one of said conductive strips the widths of said first and second channels.

2. A monitoring system as set forth in claim 1 wherein said current flow measuring means includes a source of voltage applied to said second parallel strip.

3. A monitoring system as set forth in claim 2 wherein said current flow measuring means and said voltage applying means provide voltage and current values used in a relationship for providing a ratio between the widths of said first and second channels which is a constant K.

4. A monitoring system as set forth in claim 3 wherein the width of one of said channels is determined by a relationship which is equal to 2 times the design width of one of the channels divided by the constant (K+1).

5. A monitoring system as set forth in claim 3 wherein the width of one of said channels is determined by a relationship which is equal to the design width of one of the channels minus the design width of the other of said channels divided by the constant (K−1).

6. A monitoring system as set forth in claim 3 wherein the constant K is derived in accordance with the relationship $$\frac{I1s}{I2s} \cdot \frac{(V2gs - Vt2)^2}{(V1gs - Vt1)^2},$$

where $I1s$ is the current flow in the first parallel strip produced by said first voltage and $I2s$ is the current flow in the first strip produced by said second voltage, $V1gs$ and $V2gs$ are said first and second voltages, respectively, and $Vt1$ and $Vt2$ are the threshold voltages at which current begins to pass through said first and second channels.

7. A monitoring system as set forth in claim 6 wherein said first and second channels have different design widths.

8. A monitoring system as set forth in claim 6 wherein said first and second channels have the same design width.

9. A monitoring system as set forth in claim 6 wherein an edge of each of said first and second parallel strips and an edge of each of said first and second conductive strips define said first and second conductive channels.

10. A monitoring system as set forth in claim 6 further including a conductive layer interposed between said thin dielectric medium and said first and second conductive strips, said conductive layer having first and second openings therein disposed between said first and second parallel strips, an edge of each of said openings and an edge of each of said first and second conductive strips define said first and second conductive channels.

* * * * *